United States Patent [19]

Falster et al.

[11] Patent Number: 5,418,172

[45] Date of Patent: May 23, 1995

[54] METHOD FOR DETECTING SOURCES OF CONTAMINATION IN SILICON USING A CONTAMINATION MONITOR WAFER

[75] Inventors: Robert Falster, Milan; Gabriella Borionetti, Novara, both of Italy; Robert A. Craven, Olivette, Mo.

[73] Assignee: MEMC Electronic Materials S.p.A., Italy

[21] Appl. No.: 84,405

[22] Filed: Jun. 29, 1993

[51] Int. Cl.$^6$ ............................................. H01L 21/66
[52] U.S. Cl. ........................................ 437/8; 437/142; 437/946; 437/949
[58] Field of Search .................... 437/8, 142; 148/DIG. 162

[56] References Cited

U.S. PATENT DOCUMENTS

| | | | |
|---|---|---|---|
| 3,195,218 | 7/1965 | Miller et al. | 437/142 |
| 3,272,661 | 9/1966 | Tomono et al. | 437/8 |
| 3,311,510 | 3/1967 | Mandelkorn | 437/142 |
| 3,356,543 | 12/1967 | Desmond et al. | 437/142 |
| 3,423,647 | 1/1969 | Kurosawa et al. | 437/142 |
| 3,449,644 | 6/1969 | Nassigian | 437/142 |
| 3,725,148 | 4/1973 | Kendall | 437/8 |
| 3,993,527 | 1/1976 | Tarneja et al. | 437/8 |
| 4,507,334 | 3/1985 | Goodman | 437/8 |
| 4,668,330 | 5/1987 | Golden | 156/601 |
| 4,868,133 | 9/1989 | Huber | 148/DIG. 3 |
| 4,963,500 | 10/1990 | Cogan et al. | 437/8 |
| 5,272,119 | 12/1993 | Falster | 437/12 |

FOREIGN PATENT DOCUMENTS 689626  6/1964  Canada ................. 437/142

OTHER PUBLICATIONS

GeMe Tec Product Information brochure, "Elymat: Metal Contamination Diagnostics in Silicon Wafer Processing", Gesellschaft für Messtechnik und Technologie MbH. (Date Unknown).

Porrini et al., "Growth of Large Diameter High Purity Silicon Crystals with the MCZ Method for Power Devices Applications" EPE Firenze, pp. 0-090-0-093 (1991).

Primary Examiner—Olik Chaudhuri
Assistant Examiner—S. Mulpuri
Attorney, Agent, or Firm—Senniger, Powers, Leavitt & Roedel

[57] ABSTRACT

A method for detecting transition metal contamination in or on equipment and fluids used or being evaluated for use in the manufacture, handling, or shipping of silicon wafers and electronic devices manufactured on silicon wafers. A contamination monitor wafer having an average minority carrier lifetime greater than about 250 microseconds is processed using one or more pieces of equipment or fluids. As part of, or subsequent to the processing step, the contamination monitor wafer is exposed to a temperature of at least 600° C. and the minority carrier lifetime values of the contamination monitor wafer is thereafter determined. To insure that the recombination process is dot dominated by the effects of oxygen precipitates, the contamination monitor wafer should have an oxygen precipitate density of less than $10^8$ oxygen precipitates per cubic centimeter before and after being exposed to said temperature of at least 600° C.

20 Claims, 4 Drawing Sheets

F/G.5
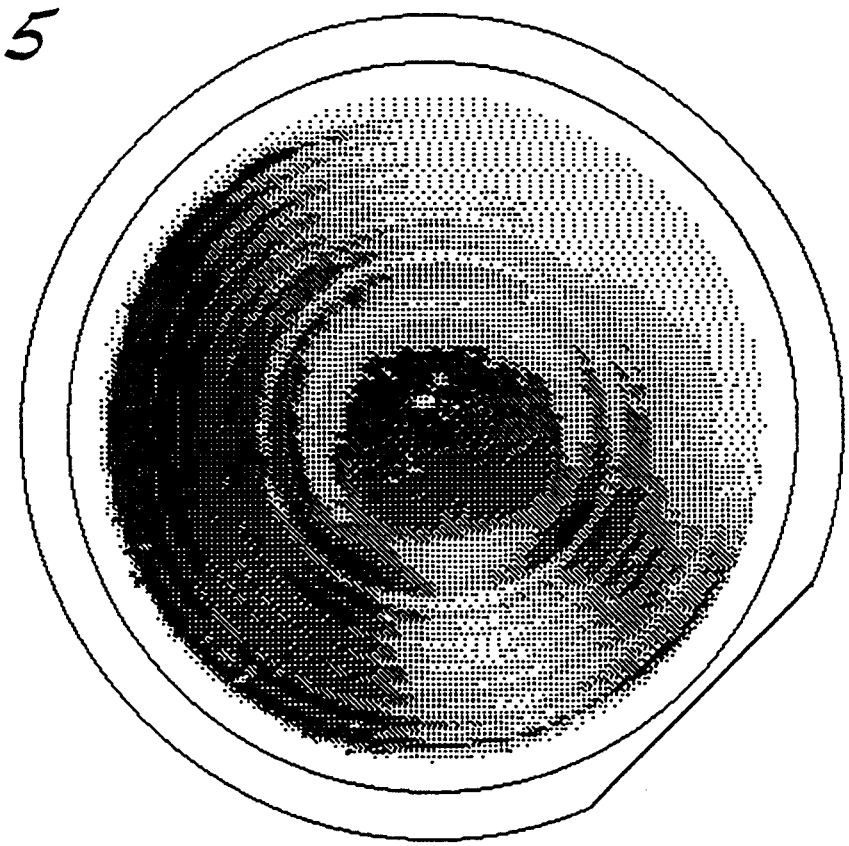
F/G.6
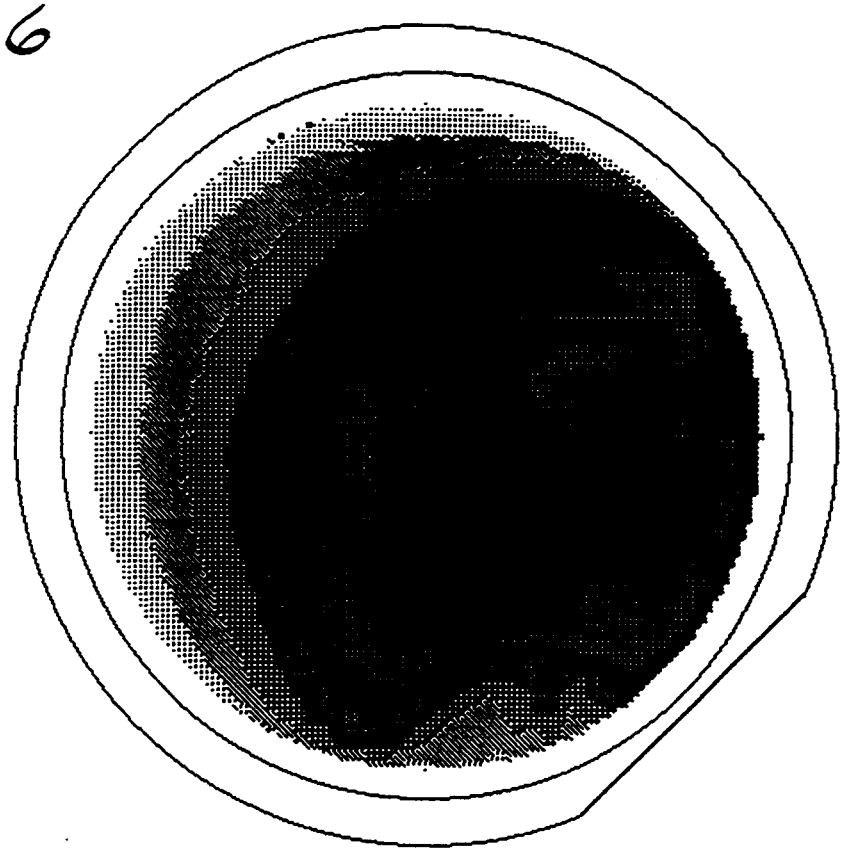

METHOD FOR DETECTING SOURCES OF CONTAMINATION IN SILICON USING A CONTAMINATION MONITOR WAFER

BACKGROUND OF THE INVENTION

The present invention is directed to a method for detecting sources of ultra-trace metal contamination in the manufacture of silicon wafers and integrated circuits, in general, and a method for detecting such sources in individual process steps using a contamination monitor wafer, in particular.

As integrated circuit technology advances and the size of electrical devices continues to decrease, the need to impose tighter limits on spurious electrical current leakage continues to increase. These leakage paths are either through minority carrier recombination at metallically contaminated point defect sites in the vicinity of electrical junctions within the device or sub-device cell structure, or through leakage paths in the oxides used as field effect gates of isolation structures. Both paths are deleteriously increased in size when the silicon wafer is contaminated with metals such as iron, copper, nickel, chromium, zinc, and titanium, in general, and iron, in particular.

The manufacture of silicon wafers and electrical devices includes a number of individual processing steps which potentially contribute to metal contamination. Such steps include wet cleaning, ion implantation, reactive ion etching, gaseous cleaning, thermal treatment and polishing. Each of these individual processing steps should be examined, therefore, to determine whether or to what extent, it contributes to metal contamination.

Others have previously proposed that a contamination monitor wafer be used in combination with various minority carrier lifetime measurement or minority carrier diffusion length techniques as "tools" to detect sources of metal contamination. Minority carrier diffusion length and minority carrier lifetime are related according to the following expression: $L_d = ((D_n(\tau_n))^{0.5}$ wherein $L_d$ is the minority carrier diffusion length in microns, $D_n$ is the election diffusion coefficient, taken to be 35 cm$^2$/sec, or 3500 $\mu^2/\mu s$ and $\tau_n$ is minority carrier lifetime in microseconds.

The minority carrier lifetime and minority carrier diffusion length of a silicon wafer are both related to the extent of metallic contamination of that wafer. Wherever references are made herein to minority carrier lifetime, it should be kept in mind that minority carrier diffusion length is for many purposes interchangeable therewith and may be substituted therefor. As disclosed in, for example, Zoth and Bergholz, J. Appl. Phys., 67, 6764 (1990), an increase in metal impurity content corresponds to a decrease in minority carrier diffusion length. According to this approach, therefore, the minority carrier lifetime, or minority carrier diffusion length of the monitor wafer is determined before and after it is subjected to one or more individual steps of a silicon wafer or electronic device manufacturing process. A comparison of the two lifetimes or lengths reveals whether, or to what extent, the processing step(s) contribute to metal contamination.

At present, there are several methods for measuring minority carrier lifetime in a silicon slice, slug or crystal, each involving the injection of excess carriers by some means. One technique involves the injection of excess carriers followed by the steady state measurement of an excess carrier dependent parameter such as surface photovoltage or photocurrent.

When making and interpreting the results of such measurements it is often assumed that metal contamination is the sole cause of minority carrier lifetime reductions and that the relative amounts of metal contamination introduced by a process step may be determined by the measurement of minority carrier lifetime. If, however, recombination paths parallel to and independent of metal contamination sites are introduced during the step which is being monitored, the interpretation of the data becomes difficult and the validity of such a minority carrier lifetime measurement to determine the amount of metal contamination introduced is greatly reduced or completely annulled. Oxygen precipitates are one such source of parallel recombination paths and they can dominate the recombination process if present in an amount greater than 10$^8$ oxygen precipitates per cubic centimeter.

The typical oxygen content of Czochralski silicon also complicates the detection of metallic defects through the formation of thermal donor states which change the sample resistivity. As a result, Czochralski grown silicon is routinely subjected to a donor annihilation at an elevated temperature prior to measurement of the minority lifetime. Such elevated temperature (e.g., at least 650° C.) heat treatments, however, are known to be strong contributors to metallic contamination—as small amounts of residual iron on the surface of the sample are driven into the sample, significantly reducing the lifetime. Donor annihilation is also disadvantageous because it can promote formation of the extended oxygen defects described above.

SUMMARY OF THE INVENTION

It is, therefore, an object of this invention to provide a contamination monitor wafer and a method for detecting sources of contamination in one or more processing steps of a silicon wafer or electronic device manufacturing process; to provide a contamination monitor wafer which has a sufficiently long minority carrier lifetime such that relatively low levels of contamination introduced by a processing step are detectable as a change in minority carrier lifetime; to provide a wafer that does not need to go through a donor annihilation step to have utility as a contamination monitor wafer; to provide a contamination monitor wafer having a decreased risk of the formation of oxygen-related defects upon exposure of the wafer to elevated temperatures; to provide a contamination monitor wafer which may be used for monitoring high temperature as well as low temperature processes.

Briefly, therefore, the invention is directed to a method for determining the relative metal contamination contributed to silicon wafers and electronic devices by an apparatus, fluid or process used in the manufacture, handling, or shipping of wafers or electronic devices. According to this method, a contamination monitor wafer having an average minority carrier lifetime of at least about 250 microseconds is exposed to the apparatus, fluid or process under conditions which simulate the manufacture, handling or shipping of wafers or electronic devices. Thereafter, the contamination monitor wafer is thereafter heated to a temperature of at least about 600° C. and its minority carrier lifetime or minority carrier diffusion length is determined. To reduce the effect of oxygen precipitates upon minority carrier lifetime, the contamination monitor wafer should not have an oxygen precipitate density greater than about $10^8$ oxygen precipitates per cubic centimeters after being heated to a temperature of at least about 600° C.

Other objects and features of the invention will be in part apparent and in part pointed out hereinafter.

BRIEF DESCRIPTION OF THE DRAWINGS

FIGS. 5 and 6 are images generated by an ELYMAT instrument topographically showing the minority carrier diffusion length of a contamination monitor wafer after processing as set forth in Example 5.

DETAILED DESCRIPTION OF THE INVENTION

Figure 1:
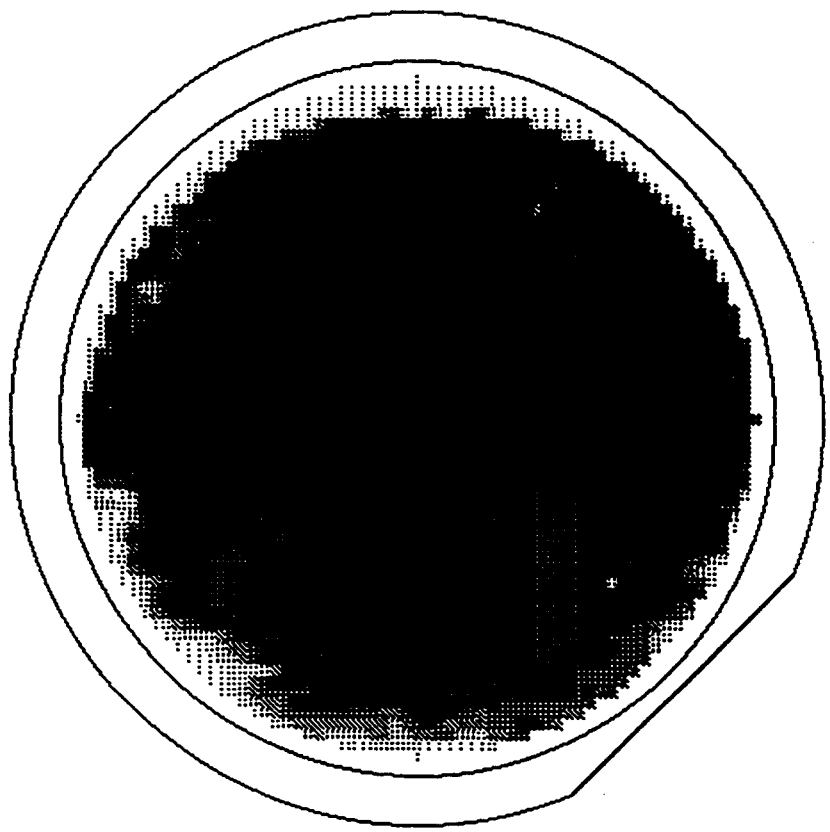
FIG. 1 is an image generated by an ELYMAT instrument topographically showing the minority carrier diffusion length of the reference contamination monitor wafer Example 1.

As used herein, all oxygen concentrations are determined in accordance with ASTM Standard F121-83 and oxygen precipitate densities may be determined by preferential chemical etching in conjunction with an optical or scanning election microscope as described in F. Shimura, Semiconductor Silicon Crystal Technology, Academic Press 1989.

For use in accordance with the method of the present invention, the single crystal silicon contamination monitor wafers preferably have an average minority carrier lifetime which is greater than about 250 microseconds. More preferably they have an average minority carrier lifetime which is greater than about 400 microseconds, and most preferably, they have an average minority carrier lifetime which is greater than about 750 microseconds.

In one embodiment of the present invention, the contamination monitor wafers are prepared from low oxygen content silicon, i.e., silicon having an oxygen content of less than about 10 ppma, and preferably less than about 7 ppma; heat-treatment of such wafers at an elevated temperature would not be expected to yield wafers having an oxygen precipitate density in excess of about $10^8$ oxygen precipitates per cubic centimeter. Low oxygen content single crystal silicon may be prepared using a variety of processes such as float-zone or Czochralski techniques, preferably magnetic Czochralski techniques. Most preferably, low oxygen content silicon is prepared using the Czochralski crystal pulling method in the presence of a transverse magnetic field (MCZ). The principles of the Czochralski method are well known in the industry and are set forth in, e.g., F. Shimura, *Semiconductor Silicon Crystal Technology*, Academic Press, 1989. MCZ has been shown to be capable of producing wafers which have a low oxygen content, between about 2 and about 10 ppma. The preferred MCZ crystal growing technique involves application of a transverse static magnetic field of about 3000 Gauss across the melt. See, e.g., Porrini & Rosetto, "Growth of Large Diameter High Purity Silicon Single Crystals with the MCZ Method for Power Devices Applications," *EPE FIRENZE*, 1991: 0-090-0-093.

Alternatively, contamination monitor wafers may be prepared from high oxygen content single crystal silicon (i.e., silicon having an oxygen content greater than about 10 ppma) provided the silicon is annealed to annihilate oxygen-related defects which form the precursors for the nucleation of oxygen precipitates. Oxygen-related defects begin to anneal out of silicon at a temperature of about 875° C. and by the time the silicon reaches about 1000° C., substantially all (e.g., >99%) of such defects have annealed out. Equilibrium appears to be reached in relatively short periods of time, i.e., on the order of 1 minute. Accordingly, the oxygen-related defects may be annihilated by annealing the silicon at a temperature of at least about 875° C. for a period of at least about 30 seconds, preferably at least about 10 minutes (hereinafter, the "precursor annihilation heat-treatment").

Significantly, heat treatment of high-oxygen silicon at a temperature in the range of about 750° to 850° C. for a period of about 10 minutes can stabilize the defects responsible for the precursors of the oxygen precipitates into a form which can no longer be broken-up by the precursor annihilation heat-treatment. Thus, it is preferred that high-oxygen silicon being given the precursor annihilation heat-treatment be heated rapidly through the 750° to 850° C. range on the way to the higher temperatures required for the annihilation, that is, it is preferred that the high-oxygen silicon not be exposed to temperatures in the range of about 750° to 850° C. for more than about 10 minutes prior to the precursor annihilation treatment.

In addition, the defects responsible for the precursors of the oxygen precipitates in high-oxygen silicon can re-form if the silicon is exposed to a temperature in the range of about 450° to about 750° C. for a period of about 30 minutes or even less. Thus, it is preferred that the high-oxygen silicon not be exposed to temperatures in the range of about 450° to 750° C. for more than about 15 minutes after the precursor annihilation treatment.

Whether the single crystal silicon ingot is prepared by float-zone, MCZ or some other technique, two silicon samples are preferably taken from the ingot, one from its seed end and one from its tail end. In certain instances it is preferred that the geometry of the samples is identical to the geometry of production wafers which are subject to the processing steps to be evaluated. A six inch diameter wafer, for example, may have a thickness of about 675 microns. In other instances it will be preferred that the samples have a thickness greater than their production wafer counterparts, for example, between about 1200 microns and about 6500 microns. The samples are etched to a bright polished appearance to remove mechanical surface damage. The etching solution may be any of a number of solutions with which those skilled in the art will be familiar including, for example, a combination of hydrofluoric, nitric and acetic acid. These growing, sampling and etching steps may be performed by the conventional methods known to those of ordinary skill in the art. Descriptions of conventional silicon processing techniques may be found in F. Shimura, *Semiconductor Silicon Crystal Technology*, Academic Press, 1989, and *Silicon Chemical*

*Etching*, (J. Grabmaier ed.) Springer-Verlag, New York, 1982 (incorporated herein by reference).

After the seed and tail samples are etched, the minority carrier lifetime of each is determined using any one of a number of techniques. Techniques which may be used to measure the minority carrier lifetime involve injecting carriers into a sample by means of a flash of light or voltage pulses and observing their decay. One preferred method for measuring minority carrier lifetime is the surface photovoltage (SPV) technique which is described in Zoth and Bergholz, *J. Appl. Phys.*, 67, 6764 (1990). Preferably, lifetime is measured using an ELYMAT instrument manufactured by GeMeTec (Munich, Germany). This instrument measures to a resolution of about 1 mm the photocurrents generated by a scanning laser beam and collected by a dilute HF electrolytic solution which forms a contact to the wafer surface. Minority carrier diffusion lengths are easily calculated from these data and diffusion length images are generated. See, e.g., H. Foell et al., Proc. ESS-DERC Conference, Berlin 1989, p. 44.

The minority carrier lifetimes of the seed and tail samples as determined by an ELYMAT instrument, SPY or otherwise are used to qualify the single crystal ingot. These values can be plotted and used to assign an estimated minority carrier lifetime value to each wafer sliced from the ingot according to its location along the length of the ingot. The minority carrier lifetime decreases along the length of the ingot.

The ingot is then processed into a plurality of wafers according to procedures which are well known in the silicon wafer field of art. The combination of operations which produces contamination monitor wafers includes trimming, orientation flatting, slicing, wafer edge profiling, lapping, etching and polishing. The wafers preferably, but not necessarily, have physical characteristics roughly similar to the characteristics of the production wafers which are exposed to the equipment or fluid(s) to be evaluated. The contamination monitor Wafer of the invention may be, for example, a p-type wafer having a normal resistivity of about 5 ohm centimeters, a thickness between about 575 and about 675 microns, and a diameter between about 70 and about 300 millimeters. The temperature of the wafer is maintained below about 100° C. during these processing steps to avoid the migration of metals into the wafer. In addition, the minority carrier lifetime of the contamination monitor wafer is determined and preferably the surface of the wafer is marked by laser to indicate this measured lifetime or the predicted lifetime as previously discussed.

To detect sources of contamination on or in equipment and fluids used in the manufacture, handling, or shipping of silicon wafers and electronic devices, a contamination monitor wafer having a predetermined ("background") minority carrier lifetime as provided is processed using one or more pieces of equipment or fluid ("unit operation"), preferably in a manner that duplicates or simulates actual process operation.

The contamination monitor wafer is then thermally treated to drive contaminants deposited on the wafer during the unit operation into the wafer. The length and temperature of the thermal treatment step should be sufficient to drive in any suspect metal contaminants into the wafer. For instance, iron is soluble in silicon at 650° C. and a typical thermal treatment for this purpose may involve exposure of a low-oxygen wafer to a temperature slightly a above about 700° C. for about 20 minutes or exposure of a high-oxygen wafer to a temperature above about 750° C. for about 20 minutes. Thermal treatments at temperatures as low as about 600° C. and at times as short as several minutes, however, may suffice for low-oxygen content wafers. It is preferred that the temperature employed is not substantially above that temperature which is sufficient to drive in contamination, that is, to allow substantially all the surface metal contamination to dissolve into the monitor wafer. If the thermal treatment temperature is not maintained near the minimum temperature necessary to drive in contamination, there is a risk of evaporation of the contaminant away from the wafer. Maintaining the thermal treatment temperature near the minimum also reduces the risk that the thermal treatment itself will affect measured lifetime values, for example, through the introduction of contamination originating with the thermal treatment equipment, atmosphere or otherwise.

Certain silicon wafer processing steps such as baking, ion implantation annealing, low temperature oxidation, polysilicon deposition and the like expose the wafer to a temperature, and for a time, sufficient to drive metals into the wafer. Thus, if one of these processing steps is being analyzed for sources of contamination it may be unnecessary to thermally treat the contamination monitor wafer upon the completion of that step, as there is no need to further drive in contamination.

After the contamination monitor wafer is exposed to the equipment or fluid to be analyzed and thermally treated, if necessary, to drive in any metal contaminants, the minority carrier lifetime of the wafer is redetermined (hereinafter, the "second" or redetermined, minority carrier lifetime) Preferably, the minority carrier lifetime is redetermined using the same technique previously used to determine the background minority carrier lifetime. In addition, so that the recombination process is not dominated by the effects of oxygen precipitates, the contamination monitor wafer should have an oxygen precipitate density less than $10^8$ oxygen precipitates per cubic centimeter, preferably less than about $5 \times 10^7$ oxygen precipitates per cubic centimeter, more preferably less than about $10^7$ oxygen precipitates per cubic centimeter, and most preferably less than about $5 \times 10^6$ oxygen precipitates per cubic centimeter after the heat-treatment.

The second and background lifetimes are related by the following expression:

$$\frac{1}{T_2} = \frac{1}{T_0} + \frac{1}{T_1}$$

where $T_0$ is the background minority carrier lifetime as provided, $T_1$ is the contribution to minority carrier lifetime degradation resulting from the exposure and any necessary thermal treatment, and $T_2$ is the second, or redetermined minority carrier lifetime of the contamination monitor wafer. In view of this relationship, it is preferred that $T_0$ be as great as possible so that $T_1$, i.e., the contribution to minority carrier lifetime degradation resulting from the exposure and any necessary thermal treatment, can be determined. For example, if $T_0$ and $T_2$ are measured to be 500 and 143 microseconds, respectively, $T_1$ can be calculated to be about 200 microseconds. A value for $T_1$ of 200 microseconds indicates that the unit operation in question is a source of contamination. A source of contamination resulting in a particular value for $T_1$ may or may not be significant, depending on the application and ultimate intended use of production wafers subjected to the unit operation being monitored. The degree of contamination corresponding to a 200 microsecond degradation in lifetime may not be tolerable for a process used in the manufacture of silicon for an advanced integrated circuit device, but may be tolerable for a process used in the manufacture of silicon for other devices.

As previously noted, the invention involves exposure of the contamination monitor wafer to an elevated temperature thermal treatment, as the sole process operation to be monitored, or as a production process operation in addition to a lower temperature unit operation to be monitored, or as a separate operation for the purposes of deliberately driving in surface contamination resulting from a lower temperature unit operation. In the latter two situations, it may be preferable to separate the lifetime-limiting effects of the contamination provided by the lower temperature operation from the lifetime-limiting effects of the thermal treatment furnace. In these embodiments a "companion" or control contamination monitor wafer having a determined background minority carrier lifetime is provided and subjected to the thermal treatment, preferably in the same cycle as the primary contamination monitor wafer, and its minority carrier lifetime is redetermined. The companion wafer, however, is not exposed to the piece of equipment or fluid which is part of the lower temperature operation to be analyzed for contamination. The contribution of the thermal treatment to minority carrier lifetime degradation can be determined by the following relationship:

$$\frac{1}{T_{2c}} = \frac{1}{T_{0c}} + \frac{1}{T_f}$$

where $T_{0c}$ is the background minority carrier lifetime of the companion wafer as provided, $T_f$ is the contribution of the thermal treatment to minority carrier lifetime degradation, and $T_{2c}$ is the redetermined minority carrier lifetime of the companion wafer as measured after the thermal treatment. In accordance with this relationship, the value for $T_f$ can be calculated from the known values for $T_{0c}$ and $T_{2c}$. This value for $T_f$, the redetermined minority carrier lifetime ($T_2$) of the primary contamination monitor wafer, and the known background minority carrier lifetime as provided ($T_0$) of the primary contamination monitor wafer are then evaluated pursuant to the following relationship:

$$\frac{1}{T_2} = \frac{1}{T_0} + \frac{1}{T_1} + \frac{1}{T_f}.$$

The resulting calculated value for $T_1$ represents the contribution to lifetime degradation of the unit operation in question independent of the contribution to degradation of the thermal treatment or other effects.

The specific value for the preferred background minority carrier lifetime will depend on several factors including, nonexclusively, the unit operation being monitored, the type and degree of contamination suspected, and the precision of evaluation desired. For a typical application where a furnace operation is being evaluated for iron contamination, the contamination monitor wafer preferably has a background minority carrier lifetime of at least about 400 microseconds. Although the lifetimes referred to herein are averages for a contamination monitor wafer, it is preferred that the individual measured lifetimes at various locations on the wafer be as uniform as possible. The degree of variation tolerable depends on the particular application and desired sensitivity.

Figure 2:
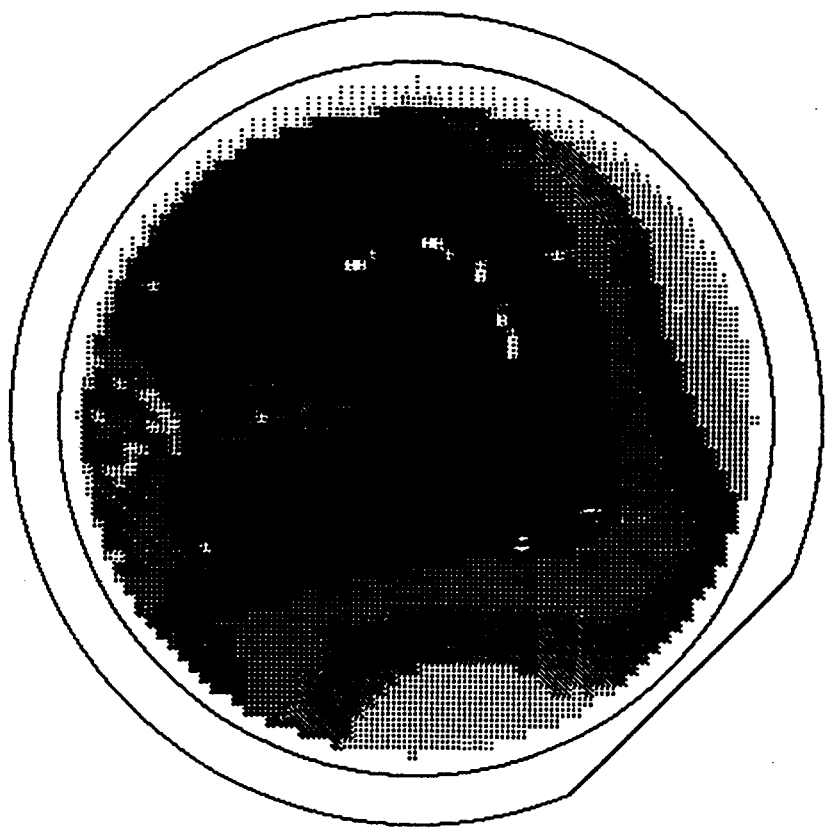
FIG. 2 is an image generated by an ELYMAT instrument topographically showing the minority carrier diffusion length of a contamination monitor wafer after processing as set forth in Example 2.
Figure 3:
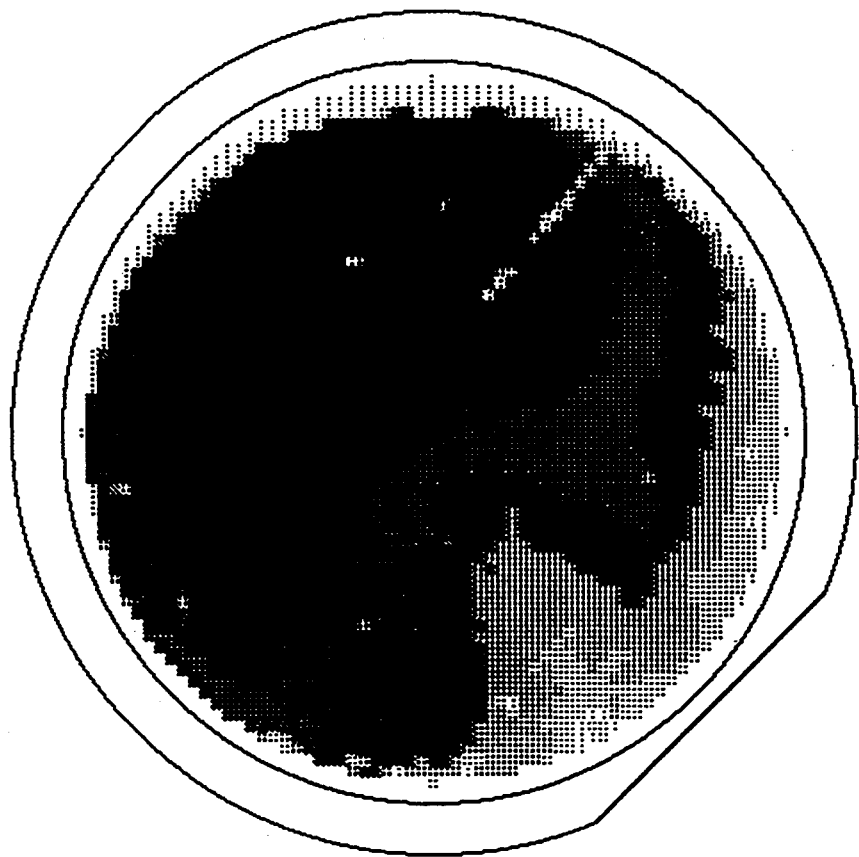
FIG. 3 is an image generated by an ELYMAT instrument topographically showing the minority carrier diffusion length of a contamination monitor wafer after processing as set forth in Example 3.
Figure 4:
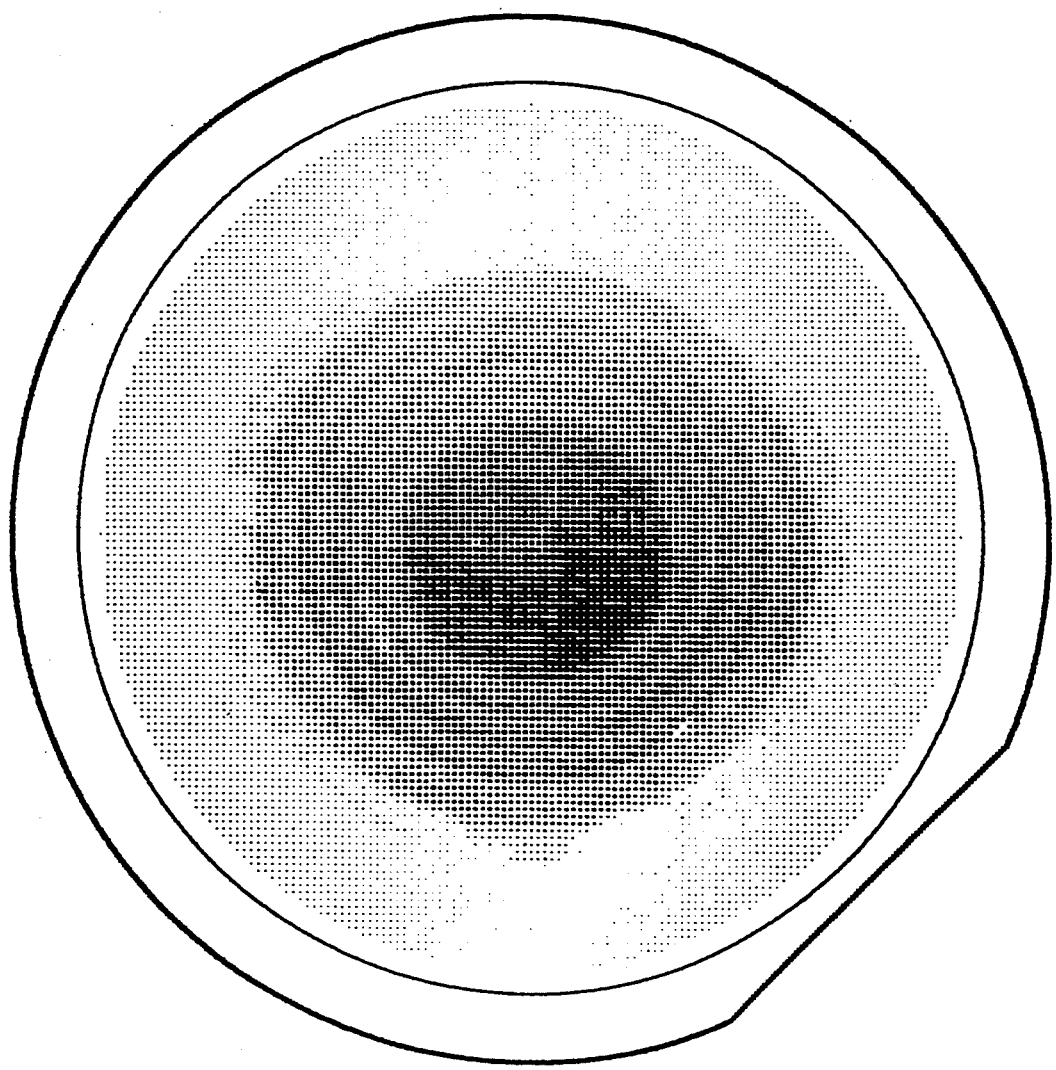
FIG. 4 is an image generated by an ELYMAT instrument topographically showing the minority carrier diffusion length of a contamination monitor wafer after processing as set forth in Example 4.

FIGS. 1–6 depict ELYMAT diffusion length images for several silicon wafers. Lighter regions on the image correspond to the more contaminated regions on the wafer having shorter lifetimes and diffusion lengths. When the ELYMAT instrument is used, the map of the wafer showing localized contamination facilitates characterization of nonuniform contamination, such as that which is often imparted by handling equipment, chucks and the like.

In certain instances it may not be necessary to compare the pre-processing and post-processing minority carrier lifetimes. This may be the case where only a rough estimate of contamination is desired or where the operator is confident that any irregularities in lifetime which appear on the processed wafer are due to process contamination and were not present on the wafer prior to processing. Foregoing the determination of background lifetime in this manner results in a less sensitive evaluation method but may be acceptable for certain applications of the invention.

The invention will now be more fully described by way of the following illustrative but not limiting, examples.

EXAMPLE 1

A single crystal silicon ingot was prepared using the Czochralski crystal pulling method in the presence of a transverse magnetic field. A wafer was sliced from the ingot and edge profiled, lapped, etched and polished into a contamination monitor wafer having a thickness of 1400 microns and a diameter of 6 inches. The estimated oxygen content of the wafer was less than 10 ppma. The wafer was evaluated using an ELYMAT instrument and the diffusion length image shown in FIG. 1 was generated. The average diffusion length of the wafer was determined to be 1221 microns, which corresponds to an average minority carrier lifetime of 426 microseconds.

EXAMPLE 2

A contamination monitor wafer having a thickness of 660 microns and a diameter of 6 inches was processed from a single crystal silicon ingot prepared by the Czochralski crystal pulling method in the presence of a transverse magnetic field. The estimated oxygen content of the wafer was less than 10 ppma. The wafer was subjected to a 1000° C., 3-hour oxidation treatment, a common processing step in integrated circuit manufacturing. The wafer was then evaluated using an ELYMAT instrument and the diffusion length image shown in FIG. 2 was generated. The average diffusion length of the wafer was determined to be 428 microns, which corresponds to an average minority carrier lifetime of 52 microseconds. The lighter areas on the diffusion length image representing lower localized diffusion lengths correspond to areas of the wafer which received greater quantities of metallic contamination during the oxidation treatment.

EXAMPLE 3

A contamination monitor wafer was prepared in the same manner and to have the same dimensions as the contamination monitor wafer of Example 2. The wafer was subjected to a 1000° C., 3-hour oxidation treatment.

The estimated oxygen content of the wafer was less than 10 ppma. The wafer was then evaluated using an ELYMAT instrument and the diffusion length image shown in FIG. 3 was generated. The average diffusion length of the wafer was determined to be 603 microns, which corresponds to an average minority carrier lifetime of 104 microseconds. The lighter areas on the diffusion length image representing lower localized diffusion lengths correspond to areas of the wafer which received greater quantities of metallic contamination during the oxidation treatment.

EXAMPLE 4

For purposes of comparison to the low oxygen monitor wafers of the invention, a 6-inch diameter contamination monitor wafer was processed from an ingot prepared by the Czochralski crystal pulling method, but not in the presence of a magnetic field as in the previous examples. Because the contamination monitor wafer was prepared by the conventional Czochralski crystal pulling method, it had an oxygen content estimated to be between about 14 and 20 ppma. The wafer was subjected to a 1000° C., 3-hour oxidation treatment. The wafer was then evaluated using an ELYMAT instrument and the diffusion length image shown in FIG. 4 was generated. The wafer's high oxygen content resulted in significant precipitation of oxygen during the oxidation treatment. The lighter areas on the diffusion length image are characterized by shorter localized diffusion lengths and represent oxygen precipitation. Due to the dominance of the effect of oxygen precipitation on the diffusion length image, it was not possible to detect the presence of metallic contamination which was introduced by the oxidation operation.

EXAMPLE 5

For purposes of comparison, two wafers originating from the same portion of conventional p-type single crystal silicon having an initial oxygen concentration of $7.5 \times 10^{17}$ cm$^{-3}$ and an average minority carrier diffusion length of about 900 microns were cleaned and heat treated at 650° C. for 30 minutes to annihilate the thermal donors and then for 800° C. for 4 hours and then at 1000° C. for 8 hours. Between the thermal donor annihilation and the start of the 800° C.+1000° C. treatment, however, one of the wafers was additionally heat treated at 1000° C. for fifteen minutes. The minority carrier diffusion length of each of the wafers was then redetermined.

FIG. 5 shows the results for the wafer which underwent only the thermal donor annihilation step followed by the 800° C.+1000° C. heat treatment. The average minoirty carrier diffusion length of this wafer was 28.4 microns and the image shows a concentric ring-like patter which is characteristic of oxygen precipitate dominated minority carrier lifetime.

FIG. 6 shows the results for the wafer which underwent the 1000° C. heat treatment between the thermal donor annihilation step and the start of the 800° C.+1000° C. heat treatment. The average value of the diffusion length for this wafer is 451 microns and there are no oxygen precipitate ring patterns present. Instead, a noticeable area of reduced lifetime is seen in the upper left hand corner of the image. The pattern of reduced diffusion length is "U-shaped" which is typical of the pattern of contamination introduced by the quartz (or graphite or silicon carbide) "boats" or holders used to hold wafers in place during furnace treatments.

Subsequent determination of the oxygen precipitate densities in the two samples revealed a high density (about $10^{10}$ cm$^{-3}$) for the sample of FIG. 5 and a very low value (less than about $5 \times 10^7$ cm$^{-3}$) for the sample of FIG. 6.

In view of the above, it will be seen that the several objects of the invention are achieved.

Although specific examples of the present invention and its application are set forth herein, it is not intended that they are exhaustive or limiting of the invention. These illustrations and explanations are intended to acquaint others skilled in the art with the invention, its principles, and its practical application, so that others skilled in the art may adapt and apply the invention in its numerous forms, as may be best suited to the requirements of a particular use.

What is claimed:

1. A method for determining the relative metal contamination contributed to silicon wafers and electronic devices manufactured on silicon wafers by an apparatus, fluid or process step used in the manufacture, handling, or shipping of the wafers or electronic devices, the method comprising:
   (a) exposing a contamination monitor wafer having an average minority carrier lifetime greater than about 250 microseconds to the apparatus, fluid or process step,
   (b) heating the contamination monitor wafer to a temperature of at least about 600° C. simultaneous with or subsequent to exposing the wafer to the apparatus, fluid or process step, and
   (c) determining the minority carrier lifetime or minority carrier diffusion length of the contamination monitor wafer after the wafer has been heated as set forth in step (b) to detect said metal contamination, the contamination monitor wafer having an oxygen precipitate density of less than $10^8$ oxygen precipitates per cubic centimeter after being heated as set forth in step (b).

2. The method of claim 1 wherein the contamination monitor wafer has an oxygen content of less than 10 ppma.

3. The method of claim 1 wherein the contamination monitor wafer has an oxygen precipitate density less than $10^7$ oxygen precipitates per cubic centimeter after being heated as set forth in step (b).

4. The method of claim 1 wherein the contamination monitor wafer has an oxygen content of at least 10 ppma and wherein prior to being exposed to the apparatus, fluid or process step the wafer is annealed at a temperature of at least about 875° C. for a period of at least about 5 minutes.

5. The process of claim 4 wherein the contamination monitor wafer is heated to a temperature of at least about 750° C. in step (b) and has an oxygen precipitate density of less than $5 \times 10^7$ oxygen precipitates per cubic centimeter after step (b).

6. The method of claim 1 wherein the surface of the contamination monitor wafer is marked with the value of the minority carrier lifetime or minority carrier diffusion length of the contamination monitor wafer prior to said processing.

7. The method of claim 1 additionally comprising:
   exposing a companion monitor wafer to a temperature above about 600° C. under circumstances which simulate or reproduce the circumstances under which the contamination monitor wafer was exposed to such a temperature, said companion monitor wafer having an average minority carrier lifetime greater than about 250 microseconds and an oxygen content less than about 10 ppma;

determining the minority carrier lifetime or minority carrier diffusion length of the companion monitor wafer; and comparing the minority carrier lifetime or minority carrier diffusion length values for the companion monitor wafer to those values determined for the contamination monitor wafer.

8. The method of claim 1 wherein the contamination monitor wafer has a minority carrier lifetime greater than about 400 microseconds prior to said processing.

9. A method for determining the relative metal contamination contributed to silicon wafers and electronic devices manufactured on silicon wafers by an apparatus, fluid or process step used in the manufacture, handling, or shipping of the wafers or electronic devices, the method comprising:

(a) exposing a contamination monitor wafer to the apparatus, fluid or processing step, the contamination monitor wafer having an oxygen content greater than about 10 ppma, an average minority carrier lifetime greater than about 250 microseconds and having previously been annealed at a temperature of at least about 875° C., (b) heating the contamination monitor wafer to a temperature of at least about 600° C. simultaneous with or subsequent to exposing the wafer to the apparatus, fluid or process step, and (c) determining the minority carrier lifetime or minority carrier diffusion length of the contamination monitor wafer after the wafer has been heated as set forth in step (b) to detect said metal contamination, the contamination monitor wafer having an oxygen precipitate density of less than $5 \times 10^7$ oxygen precipitates per cubic centimeter after being heated as set forth in step (b).

10. The method of claim 9 wherein prior to being exposed to the apparatus, fluid or process step the wafer is annealed at a temperature of at least about 875° C. for a period of at least about 5 minutes.

11. The method of claim 9 wherein prior to being annealed the contamination monitor wafer is not exposed to a temperature in the range of about 750° C. to 850° C. for more than about 10 minutes.

12. The method of claim 9 wherein subsequent to being annealed the contamination monitor wafer is not exposed to a temperature in the range of about 450° C. to 750° C. for more than about 15 minutes.

13. The process of claim 9 wherein the contamination monitor wafer is heated to a temperature of at least about 750° C. in step (b) and the contamination monitor wafer has an oxygen precipitate density of less than $10^7$ oxygen precipitates per cubic centimeter after step (b).

14. The method of claim 9 wherein the contamination monitor wafer has a minority carrier lifetime greater than about 400 microseconds prior to being exposed to the apparatus, fluid or processing step.

15. The process of claim 9 wherein the contamination monitor wafer has an oxygen precipitate density of less than about $5 \times 10^6$ oxygen precipitates per cubic centimeter after step (b).

16. The method of claim 1 wherein the contamination monitor wafer has an oxygen content of at least 10 ppma and wherein prior to being exposed to the apparatus, fluid or process step the wafer is annealed at a temperature of at least about 875° C. for a period of at least about 30 seconds.

17. The method of claim 16 wherein prior to being annealed the contamination monitor wafer is not exposed to a temperature in the range of about 750° C. to 850° C. for more than about 10 minutes 18. The method of claim 16 wherein subsequent to being annealed the contamination monitor wafer is not exposed to a temperature in the range of about 450° C. to 750° C. for more than about 15 minutes.

19. The process of claim 1 wherein the contamination monitor wafer is heated to a temperature of at least about 750° C. in step (b) and the contamination monitor wafer has an oxygen precipitate density of less than $10^7$ oxygen precipitates per cubic centimeter after step (b).

20. A method for determining the relative metal contamination contributed to silicon wafers and electronic devices manufactured on silicon wafers by an apparatus, fluid or process step used in the manufacture, handling, or shipping of the wafers or electronic devices, the method comprising:

(a) exposing a contamination monitor wafer to the apparatus, fluid or processing step, the contamination monitor wafer having an oxygen content greater than about 10 ppma, an average minority carrier lifetime greater than about 250 microseconds and having previously been annealed at a temperature of at least about 875° C. for at least about 30 seconds, (b) heating the contamination monitor wafer to a temperature of at least about 600° C. simultaneous with or subsequent to exposing the wafer to the apparatus, fluid or process step, and (c) determining the minority carrier lifetime or minority carrier diffusion length of the contamination monitor wafer after the wafer has been heated as set forth in step (b) to detect said metal contamination, the process being further characterized in that the contamination monitor wafer has an oxygen precipitate density of less than $1 \times 10^7$ oxygen precipitates per cubic centimeter after being heated as set forth in step (b), and the contamination monitor wafer is not exposed to a temperature in the range of about 750° C. to 850° C. for more than about 10 minutes prior to being annealed or to a temperature in the range of about 450° C. to 750° C. for more than about 15 minutes subsequent to being annealed.

* * * * *